United States Patent [19]

Delabastita et al.

[11] Patent Number: 5,677,093

[45] Date of Patent: Oct. 14, 1997

[54] SIZE MODULATED STOCHASTIC SCREENING

[75] Inventors: Paul Delabastita, Antwerpen; Jacobus Bosschaerts, Mortsel; René Govaert, Kapellen, all of Belgium

[73] Assignee: Agfa-Gevaert N.V., Mortsel, Belgium

[21] Appl. No.: 618,680

[22] Filed: Mar. 20, 1996

[30] Foreign Application Priority Data

Mar. 22, 1995 [EP] European Pat. Off. ............ 95200712

[51] Int. Cl.$^6$ .................... G03F 7/07; G03F 7/20
[52] U.S. Cl. ............... 430/30; 430/204; 430/264; 430/301; 430/302; 430/494; 358/475; 358/298; 358/480
[58] Field of Search ............... 430/30, 204, 494, 430/301, 302, 264; 358/475, 480, 298

[56] References Cited

U.S. PATENT DOCUMENTS 5,196,290  3/1993  Coppens et al. ............ 430/204

Primary Examiner—Richard L. Schilling
Attorney, Agent, or Firm—Brumbaugh, Graves, Donohue & Raymond

[57] ABSTRACT

A method for generating a screened reproduction of a multiple tone image comprises the steps of frequency modulation or stochastic screening the multiple image to obtain screened data representing tones of the multiple tone image in terms of halftone dots; reproducing the halftone dots on an imaging element by means of a scanwise exposure, wherein the size or composition of the halftone dot is modulated, by varying the number of microdots (or rels) composing a halftone dot.

3 Claims, 12 Drawing Sheets

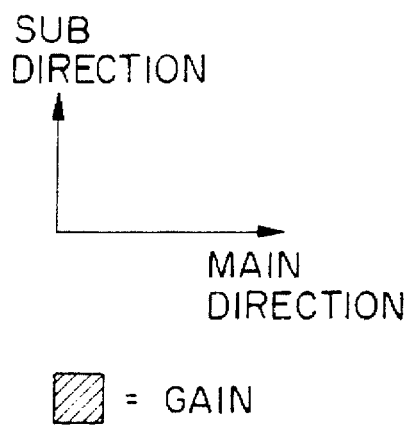
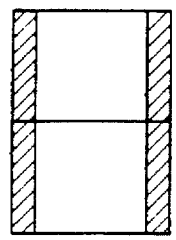
FIG. 14A
FIG. 14B
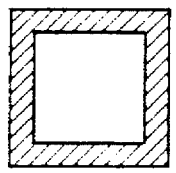
FIG. 14C
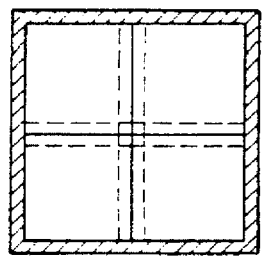
FIG. 14D

SIZE MODULATED STOCHASTIC SCREENING

DESCRIPTION

FIELD OF THE INVENTION

The present invention relates to a method for generating a screened reproduction of a contone image by means of a frequency modulation of the original, and more particulary to a method for making a lithographic printing plate according to the silver salt diffusion transfer process.

BACKGROUND OF THE INVENTION

A number of reproduction methods are only capable of reproducing a small number of image tones. For example, offset printing or electrophotographic printing methods are only capable of printing two tone values i.e. deposit ink or toner or not. In order to reproduce images having continuous tones, a halftoning or screening technique is used.

A halftoning technique converts a density value into a geometric distribution of binary dots that can be printed. The eye is not capable of seeing the individual halftone dots, and only sees the corresponding "spatially integrated" density value.

Two main classes of halftoning techniques have been described for use in the graphic arts field. These two techniques are known as "amplitude modulation screening or autotypical screening" (abbreviated as AM) and "frequency modulation screening or stochastic screening" (abbreviated as FM). Reference is made to FIGS. 1 and 2, wherein FIG. 1 illustrates an arrangement of microdots (in a bitmap) as used in amplitude modulation; and wherein FIG. 2 illustrates an arrangement of microdots (in a bitmap) as used in frequency modulation. For a clear understanding, most of the relevant technical terms used in the present application are explained in a separate chaptre at the beginning of the detailed description (see later on).

According to amplitude modulation screening, the halftone dots, that together give the impression of a particular tone, are arranged on a fixed geometric grid. By varying the size of the halftone dots the different tones of an image can be simulated. Consequently this AM-technique can also be called "dot size modulation screening".

According to frequency modulation screening, the distance between the halftone dots is modulated rather than their size. This FM-technique, although well known in the field of low resolution plain paper printers, has not obtained much attention for offset printing and other high end printing methods, probably because of the disadvantages to be discussed further on.

Both classes of halftone techniques are used in combination with a digital film recorder. A typical digital film recorder consists of a scanning laser beam exposing a photosensitive material at high resolution. The photosensistive material can be a photographic film, from which later on a printing plate is prepared by means of photomechanical techniques.

As the present invention relates more specifically to a method for preparing a lithographic printing plate, in particular to a method for preparing a lithographic printing plate comprising the steps of informationwise exposing an imaging element and thereafter processing the exposed imaging element by a diffusion transfer process, some additional background is now given hereinafter.

Lithographic printing is the process of printing from specially prepared surfaces, some areas of which are capable of accepting ink (called "oleophilic" areas) whereas other areas will not accept ink (called "oleophobic" areas). The oleophilic areas form the printing areas while the oleophobic areas form the background areas.

Two basic types of lithographic printing plates are known. According to a first type, socalled "wet" printing plates, either water or an aqueous dampening liquid and ink are applied to the plate surface that includes hydrophilic and hydrophobic areas. The hydrophilic areas are soaked with water or the dampening liquid and are thereby rendered oleophobic while the hydrophobic areas will accept the ink. A second type of lithographic printing plate operate without the use of a dampening liquid and is called "driographic" printing plate. This type of printing plate comprises highly ink repellant areas and oleophilic areas.

Lithographic printing plates can be prepared using a photosensitive lithographic printing plate precursor, referred to herein as an "imaging element". Such an imaging element is exposed in accordance with the image data and is generally developed thereafter so that a differentiation results in ink accepting properties between the exposed and unexposed areas.

Silver salt diffusion transfer processes are known and have been described, for example, in U.S. Pat. No. 2,352,042 and in the book "Photographic Silver Halide Diffusion Processes" by Andre Rott and Edith Weyde—The Focal Press—London and New York (1972).

From the above it will be clear that lithographic printing is only capable of reproducing two tone values because the areas will either accept ink or not. Thus lithographic printing is a socalled "binary" process. As mentioned hereabove, in order to reproduce originals having continuously changing tone values by such processes, halftone screening techniques are applied. Yet the rendering of small dots still presents an important problem as is explained hereinafter.

Laser imagesetters and "direct to plate" recorders expose halftone image on graphic arts film and plates by means of laser beam scanning and modulation. The faithful rendition of halftone levels, represented by binary bitmap images, is different to achieve because the image is distorted by the gaussian intensity distribution of the laser beam (FIG. 3 sketches a three-dimensional distribution of a Gaussian laser beam) and the sensitometric characteristics of the film and plate material. This distortion changes the rendition of the halftone levels, small dots (positive or negative) in highlights and shadows may be rendered two small (over- and underexposure) and halftone dots tend to print unevenly or not at all. Generally, a black dot in a white area is called "a highlight", whereas a white dot in a dark area is called "a shadow".

Such distortion in size during printing is often called "recorder gain", comprising either a "dot gain" or a "dot loss". In this context, dot gain is the increase in the size of the halftone dots during printing compared to their size on a film or plate. For example, a 50% relative dot area on the film may print a dot of 70%. In this case, the dot gain is said to be 20% (cfr. "Application of a dynamic measurement for the investigation of the causes of dot gain in web offset lithography". Pobboravsky et al., TAGA 1989 Proceedings, Rochester, page 482). If FIG. 4 illustrates an actual "platepress curve", one can see that a reproduction afflicted by a great dot gain is too dark anywhere except for the extreme highlight and shadow tones. Furthermore, the tonal contrast has become too large in the midtones and too small in the shadows: detail contrast has been lost.

The distortion will be most noticeable in small dots, whereby not only the edges but also the density of the dot will not be rendered optimally. At the other end of the tone scale small unexposed areas will become fogged by the influence of light beams exposing the surrounding area. This means that the faithful rendition of small dots is extremely difficult.

As the highlight tones in FM screening relate to a dispersion of separate halftone dots, the experience that during printing, a FM screen in the lower tonal steps often has a dot loss, can be explained. A probable reason is that the sum of the lengths of the sides of all printing FM dots (cfr. FIG. 2) in the lower tone values is greater than the circumference of an AM dot (cfr. FIG. 1) of the same percentage value or coverage.

Apart of the just mentioned problem of and probable reason for dot gain and dot loss, many halftoning techniques also share the disadvantage of a socalled poor "photomechanical behavior or physical reconstruction function". These terms means that the photomechanical properties of an imaging element on which a halftone pattern is recorded depend to a great extent on the interaction between the layout of that halftone dot pattern and the imaging characteristics of the device on which it is rendered, also referred to as the physical reconstruction function of the rendering device. A thorough explanation of said photomechanical behavior or physical reconstruction function has been described in EP-A 94.202.329.2 (in the name of Agfa-Gevaert).

From same said application, some illustrative drawings (cfr. FIGS. 14.1 to 14.4) are taken over, in order to initiate some extra hinsight into the problem of recorder gain. Herein, FIGS. 14.1 and 14.2 illustrate dot gain occurring with dots lined up along the main scan and sub scan direction respectively; FIGS. 14.3 and 14.4 illustrate dot gain resulting from replication of microdots with that of a single halftone dot having the same total area.

As to a possible solution for this problem, some different approaches might be undertaken.

First, an overall compensation by applying a higher or lower laser power is not acceptable because overexposure makes the small highlight dots larger but fills up the small shadow dots and underexposure reverses this effect, opening up the shadows but reducing the highlights. Both over- and underexposure will reduce the number of rendered halftone levels considerably.

Second, theoretically, the best results can be obtained using a laser beam with an optimum spot size for each scan resolution in combination with a graphic arts film or plate characterized by a high gradient and steep toe. This requires imagesetters with tight manufacturing tolerances and the use of films with special (socalled "explosive") development techniques.

Another method for reducing the problems created by recorder gain in FM halftoning is "pixel replication", i.e., the combination of microdots (or "rels") rendered at the fundamental recoder pitch into effectively larger halftone dots by replication. The fact that the total gain in dot size is smaller when the halftone dots are rendered using a matrix of smaller microdots is illustrated in the already mentioned FIGS. 14.1 and 14.2. Pixel replication has been used comercially in the "COBRA" raster image processor of Miles Inc., Agfa Division. As indicated in FIGS. 14.3 and 14.4 a reduction of dot gain is achieved. Further improvement has been described in the already mentioned application EP-A 94.202.329.2 (which is incorporated herein by reference), but the reproducebility of dispersed highlights is not yet ideal, especially not if applied for preparing lithographic printing plates.

A fourth approach is described in EP-A 94.203.587.4 (in the name of Agfa-Gevaert), characterised in that the frequency modulated halftone dot with the greatest main dimension on a lithographic printing plate has a main dimension of more than 21 μm. Yet the reproducibility of dispersed highlights is not yet ideal.

Still another approach has been disclosed very recently under the title "Wavelets as a tool for the construction of a halftone screen", by T. Mitsa and P. Brathwaite, University of Iowa, USA (presented at the IS&T—SPIE Symposium on Electronic Imaging, February 1995). Although this disclosure indicates to lead to a reduced graininess in the output halftone image, the problem of reproducebility of (dispersed) highlights still remains present.

In general, it may be stated than in FM-screening principally a compromis has to be taken between two conflicting interests: either a reduced graininess (especially problematic in the midtones), either a reproducability of extreme tones (especially problematic in dispersed invention to bring a surprisingly good compromise, in particular a good reproducability of extreme tones and also a reduced graininess in the midtones.

OBJECTS OF THE INVENTION

It is an object of the present invention to provide a method for generating a screened reproduction of a contone image with improved reproduction characteristics, also called gradation characteristics, especially in the highlights and shadow tones of an image.

It is also an object of the present invention to provide a method for making a lithographic printing plate according to the DTR-process from a printing plate precursor by means of frequency modulation screening an original with improved printing properties, e.g. a larger development latitude, an extended tone scale in print, and an extended usable lifetime of said printing plate.

Further objects of the present invention will become clear from the description hereinafter.

SUMMARY OF THE INVENTION

According to the present invention there is provided a method for generating a screened reproduction of a multiple tone image comprising the steps of frequency modulation screening said multiple image to obtain screened data representing tones of said multiple tone image in terms of halftone dots; reproducing said halftone dots on an imaging element by means of a scanwise exposure, wherein the size or composition of said halftone dot is modulated, by varying the number of microdots (or rels) composing a halftone dot.

Also provided by the present invention is a method wherein said imaging element is a lithographic printing plate precursor having a surface capable of being differentiated in ink accepting and ink repellant areas upon scanwise exposure and an optional development step.

BRIEF DESCRIPTION OF THE DRAWINGS

FIG. 14A and 14B illustrates dot gain occurring with dots lined up along the main scan and sub scan direction respectively;

FIGS. 14C and 14D illustrate dot gain resulting from replication of rels with that of a single halftone dot having the same total area;

DETAILED DESCRIPTION OF THE INVENTION

Figure 1:
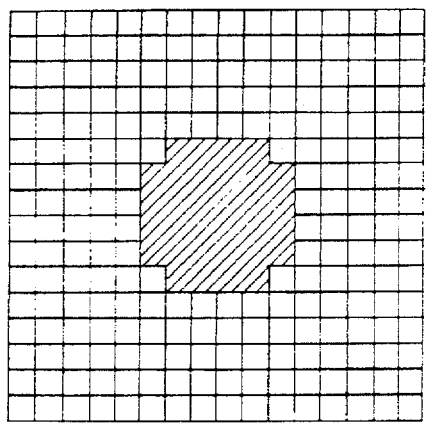
FIG. 1 illustrates an arrangement of microdots as used in amplitude modulation.
Figure 2:
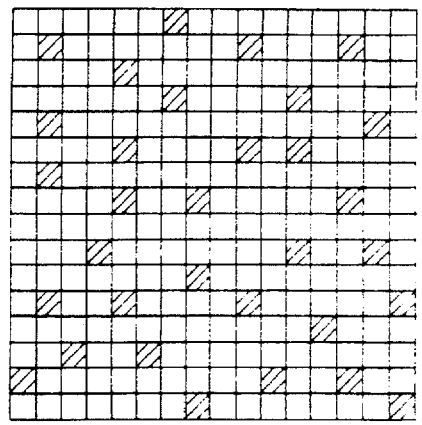
FIG. 2 illustrates an arrangement of microdots as used in frequency modulation screening.
Figure 3:
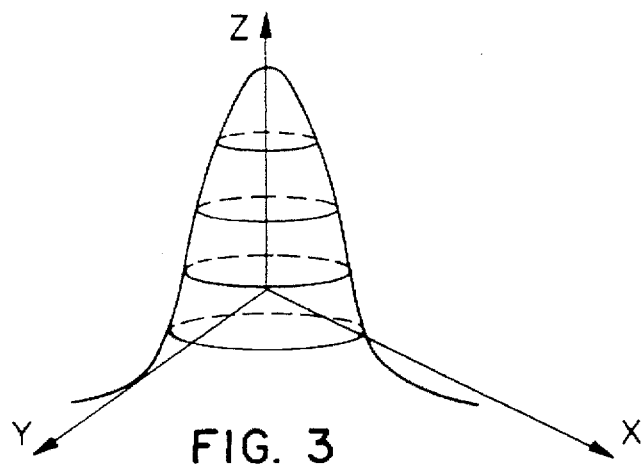
FIG. 3 is a three-dimensional distribution of a Gaussian laser beam.

The description given hereinbelow mainly comprises four chapters, namely (i) terms and definitions used in the present application. (ii) preferred embodiments of size modulation stochastic screening, (iii) preferred embodiments for making a lithographic printing plate, and (iv) further applications of the present invention.

Explanation of terms and definitions used in the present description

As an aid to understanding the discussion to follow, the meaning of some specific terms applying to the specification and to the claims are explained.

An "original" is any (hardcopy or softcopy) representation containing information representative for density values (e.g. density, transmission, opacity . . . ) of an image. The term original also includes a socalled "synthetic image", e.g. compared by a computer program.

Each original is composed of a number of picture elements, shortly called "pixels". The number of pixels depends on the spatial resolutions in mainscan or fastscan direction X and in subscan or slowscan direction Y.

A "contone (or continuous tone) image" or a "multiple tone image" is a representation by digital data, either explicit (previously generated) or implicit (generated on the fly) of a contone original. A contone image comprises a matrix of elements; each element can take C different values of contone levels, wherein the number C of possible values must be greater than two (C>2; e.g. C=256).

A "halftone image" is a representation by digital data of a contone original. A halftone image comprises a matrix of elements, wherein the number of possible values H of said elements is lower than the corresponding number of contone levels C.

A "micro dot" or "elementary dot" or "recorder element" (generally abbreviated as "rel") is the smallest spatially addressable unit on a recording device. A rel can have any form, such as rectangular or hexagonal, or circular, or square.

In connection with photographic materials which were subjected to a process comprising a frequency modulation screening of an original, a frequency modulated "halftone dot" is the smallest image unit that is rendered on said photographic material after exposing and processing said material. The size of a halftone dot can be equal to the size of a rel or may comprise several rels. A halftone dot can have any form, but usually its shape is square or rectangular.

A "halftone neigbourhood" (of a halftone image) comprises a fixed number of rels in a predetermined arrangement. A halftone neigbourhood can have any form, but in a preferred embodiment its shape is square or rectangular. The "size of a halftone neigbourhood" is meant to being the length of a side when said halftone neigbourhood is a square; the length when said halftone neigbourhood is a circle; the longest axis when said halftone neigbourhood is an ellipse and the square root of the surface area when said halftone neigbourhood has another form. By the term "neigbouring halftone dot" is meant each halftone dot in the neigbourhood of a specific halftone dot within a distance equivalent to the size of a halftone neigbourhood.

A frequency modulated halftone dot is obtained by a mechanical, an optical, and/or an electrical manipulation of the recording beam of the recording device. Although a halftone dot can consist of precisely one rel, preferably said halftone dot consists of a [m*n] matrix of rels, wherein m represents 2 or a greater integer and n represents 1 or a greater integer.

Although m and n can have different values they are preferably equal, yielding a halftone dot that is essentially a square, or optionally a rectangle if the mainscan-addressability X differs from the subscan-addressability Y.

Preferred embodiments of size modulated stochastic screening

Figure 5:
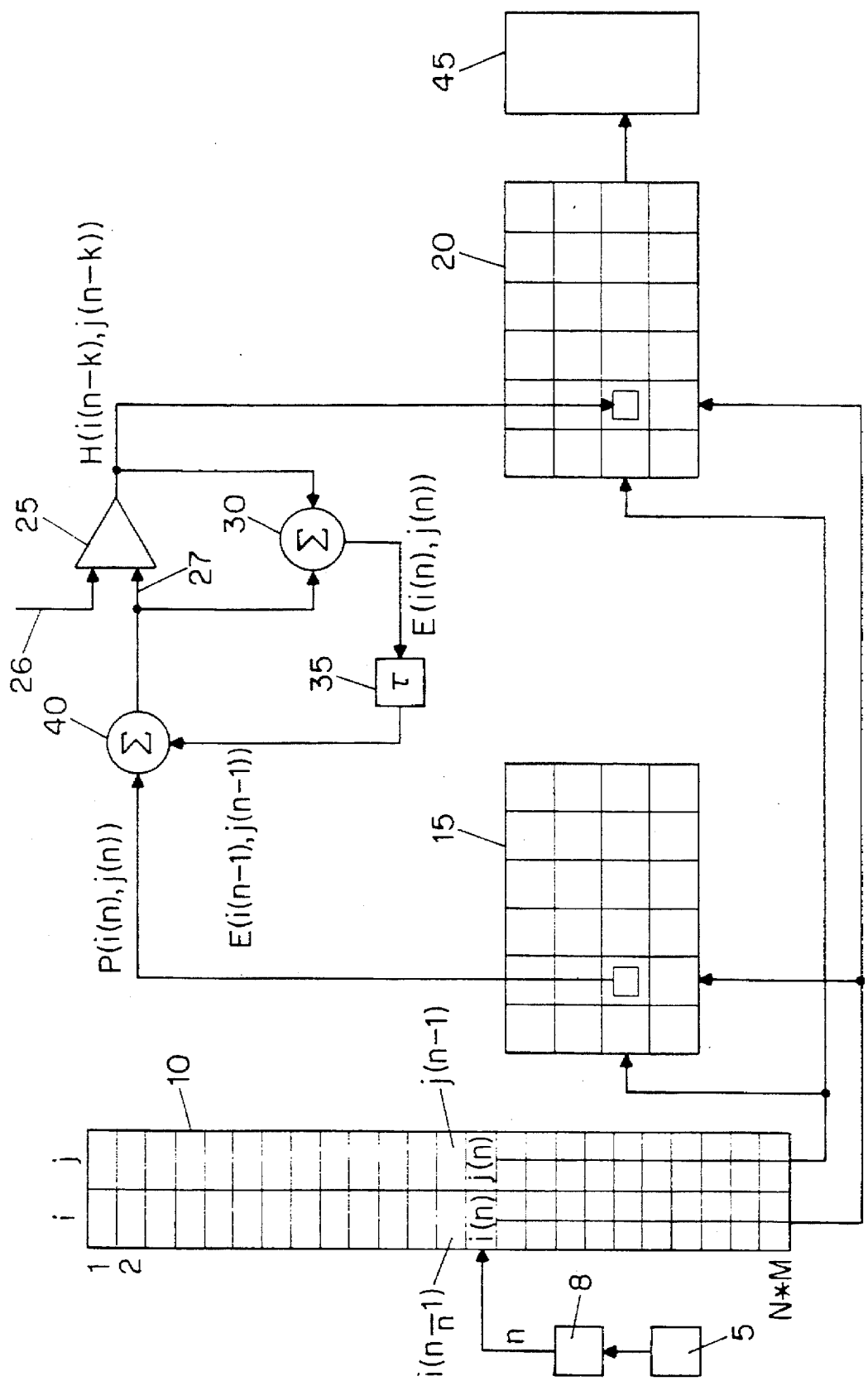
FIG. 5 is a schematic representation of a circuit for implementing a halftoning method suitable for use in the present invention.

Before explaining a full detail FIG. 5, which shows a circuit to perform a frequency modulation screening usable for the present invention, first some basic information has to be given.

Generally, if an image is scanned, the image information is converted into tone or grey values, normally between 0 (e.g. solid-tone) and 255 (e.g. white). For the resulting halftone film, however, there are only two possible states: the image area is either black (i.e. printing) or white (i.e. non-printing). The continuous-tone signal produced by the scanner (between 0 and 255; or 1 and 256) must therefore be transformed into a binary value (1 or 0). The simplest possibility is to code all grey values above a certain threshold value with 1 and the remainder with 0. It is obvious that, in this way, a large part of the image information is lost.

In order to obtain a better reproduction result, various dot frequency modulation screening techniques are suitable. They can be divided into the following subclasses:

1) Point to Point thresholding based techniques:
2) Error Diffusion along a line by line, column by column scan;

3) Error Propagation along a Hilbert scan;

4) Special techniques.

As these frequency modulation screening techniques are explained in an application entitled "Time modulated stochastic screening" and filed on the even day, in the present description no explicit replication is necessary.

Now, attention is given to FIG. 5, which shows a circuit to perform a frequency modulation screening (by error diffusion) in combination with a binary recording device, e.g. an image-setter. First different building blocks of this circuit are described, later on its operation will be explained.

Block 15 (sometimes called "pixelmap") is a memory block containing the contone dot values of an image. Typically these are 8 bit values, organized as N lines with M columns. Block 20 (generally called bitmap) is a memory block with the same lay-out as block 15, in which the the halftoned pixel values will be stored. In the case of a binary recording device, every halftone pixel word has a length of 1 bit. Block 45 is a device capable of imagewise exposing a substrate e.g. a photographic film or a lithographic printing plate precursor using the information in block 20. Block 40 is an arithmetic unit capable of calculating the sum of the pixelvalue P(i,j) and the error E at the output of a delay register 35. The conversion of a contone pixel value into a halftoned pixel value takes place in block 25. This conversion may be based on a thresholding operation: if the contone value at point (i,j) is below the value of 127, a value "0" is stored in the halftone memory, otherwise a "1" is stored. Block 30 contains an arithmetic unit that is capable to calculate the error between the original contone value, and the halftoned pixel value, and to store it in the delay register 35. Block 8 is a counter that sequences the processing of the N*M pixels of the image. Block 10 is a LUT with N*M entries (one for every image pixel), and a unique combination of a row and column address that corresponds with one pixel position in the image. Block 5 is a clock.

The operation of FIG. 5 is now explained. At every clock pulse, the counter 8 is incremented, and a new pair of coordinates i(n),j(n) is obtained from block 10. These coordinates are used as address values to the pixel memory 15, to obtain a contone pixel value P(i(n),j(n)). This pixel value is immediately added to the error E(i(n−1),j(n−1), that was stored in register 35 after the previous halftone step, and the sum of both is compared to the threshold value 26 in block 25. The outcome of the thresholding operation determines the value H(i(n),j(n)) that will be written into the halftone pixel memory at position i(n),j(n). At the same time a new error E(i(n),j(n)) is calculated from the difference between P(i(n),j(n)) and H(i(n),j(n)), and stored in the delay register 35. The circuit is initialized by setting the counter 8 to "1", the error to e.g. "256", and the operation is terminated when the counter reaches the level N*M. After that, the halftone memory 20 is read out line by line, column by column, and its contents are recorded on a substrate by the recorder 45.

Each contone or multiple tone image pixel is carrying information about an address and an image signal. Each image signal is transformed to a bitmap signal B, being represented by e.g. an 8 bit value, depending (amongst others) on the required quality, memory capacity and performance. The contone image signals have preferably values from 0 to 255, whereas the halftone image signals preferably have lower values (generally only 2). But all other number of signal levels can be handled by the same method.

In such an imagesetter a socalled "raster image processor" (RIP) builds a binary bitmap image in memory, representing the halftone values, before sending the information as individual scan lines to the exposure unit. The presence of small dot areas, negative or positive, in the bitmap image can easily be detected by a special algorithm to be included (by software or by hardware implementation) in the bitmap creation functions of the RIP.

In the exposure unit the size of the halftoned dots can be controlled and automatically adjusted to enhance the rendition of small dot areas. So, in the raster image processor (RIP) the bitmap information is modified selectively to correct the rendition of small dots.

Small halftone dots are obtained by exposing a small number of rels, e.g. a small dot of 2 by 2 rels is exposed by turning the laser exposure on for two rels in two consecutive scan lines. The exposure of a small number of rels can easily be detected by checking the presence of consecutive rels in a scan line. When the exposure sequence stays below a predefined limit (e.g. two rels), the exposure is made extended automatically by at least one rel, without changing the rendition of the large halftone dot areas.

The same method can be used to correct the inverse halftone dots, as e.g. a small unexposed area surrounded by a large exposed area. This makes the unexposed area somewhat larger to make sure that small dots in the shadows are rendered correctly.

According to a preferred embodiment of the present invention, a method for generating a screened reproduction of a multiple tone image comprises the steps of frequency modulation screening said multiple image to obtain screened data representing tones of said multiple tone image in terms of halftone dots; reproducing said halftone dots on an imaging element by means of a scanwise exposure; characterised in that said scanwise exposure for rendering a halftone dot is size modulated.

Figure 8:
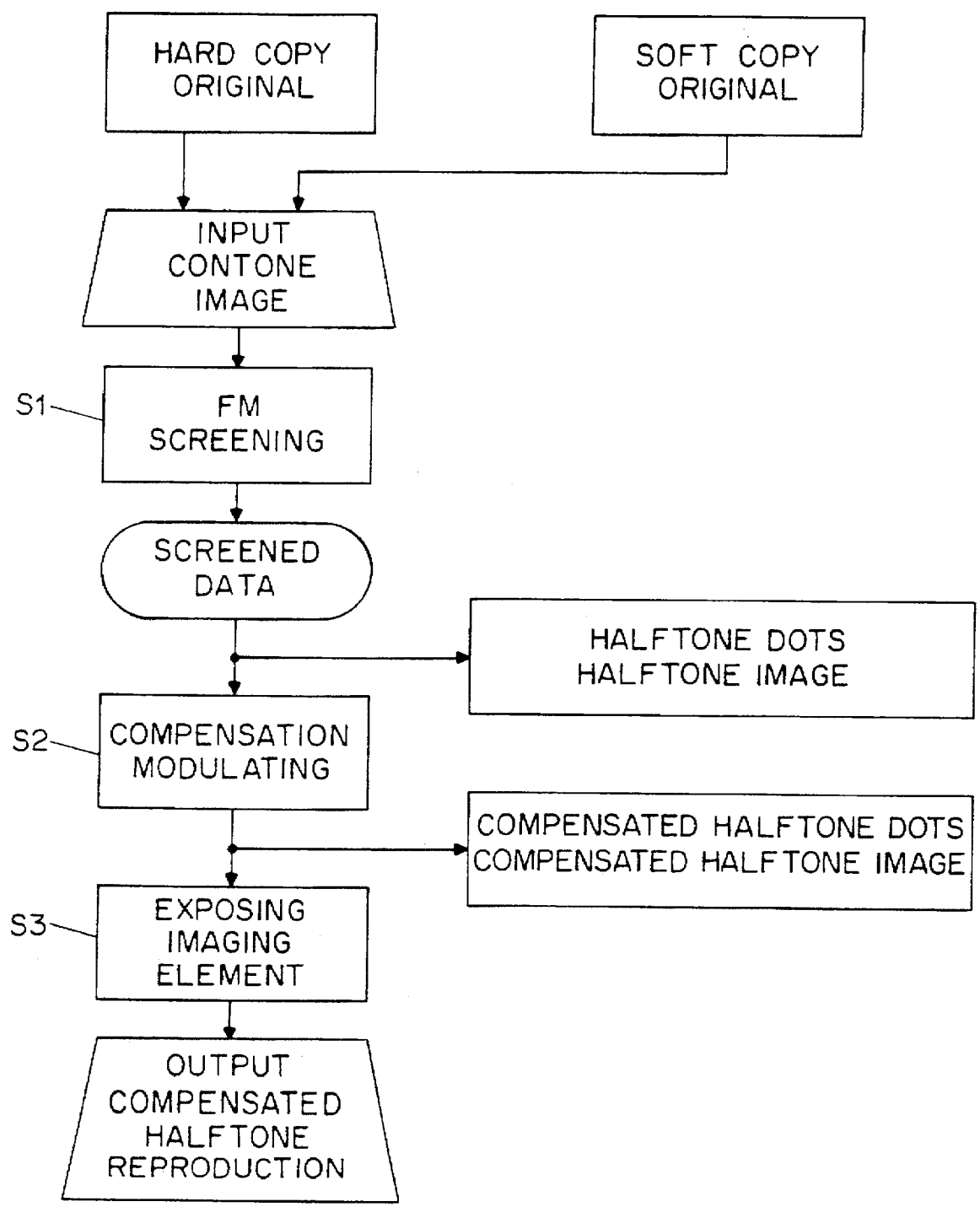
FIG. 8 is a flowchart illustrating basic steps of a first embodiment according to the present invention.

In reference to FIG. 8, which illustrates basic steps of this method, it may be indicated that said screened data represent (still uncompensated) halftone dots, that one or more light sources may be used, and that said modulating is carried out in accordance to a location of corresponding halftone dots on a tone scale of said imaging element.

Because in one part of a tone scale of an imaging element or imaging system the number of halftone dots may be low and in another part of said tone scale the number of halftone dots may be high, different size compensation data may be applied, said size compensation data are indicated as being "depending on the the location" of the corresponding halftone dots on said tone scale of said imaging element. Said size compensation data with respect to a tone value on a tone scale thus relate to a percentage of occupance or coverage. Thus in a preferred embodiment of the present invention, an exposure for rendering halftone dots is varied in acccordance with a particular tone to be reproduced. In practice, a size of a halftone dot for rendering halftone dots of low tones is increased relative to halftone dots of mid tones, whereas a size of a halftone dot for rendering halftone dots of high tones is decreased.

Figure 9:
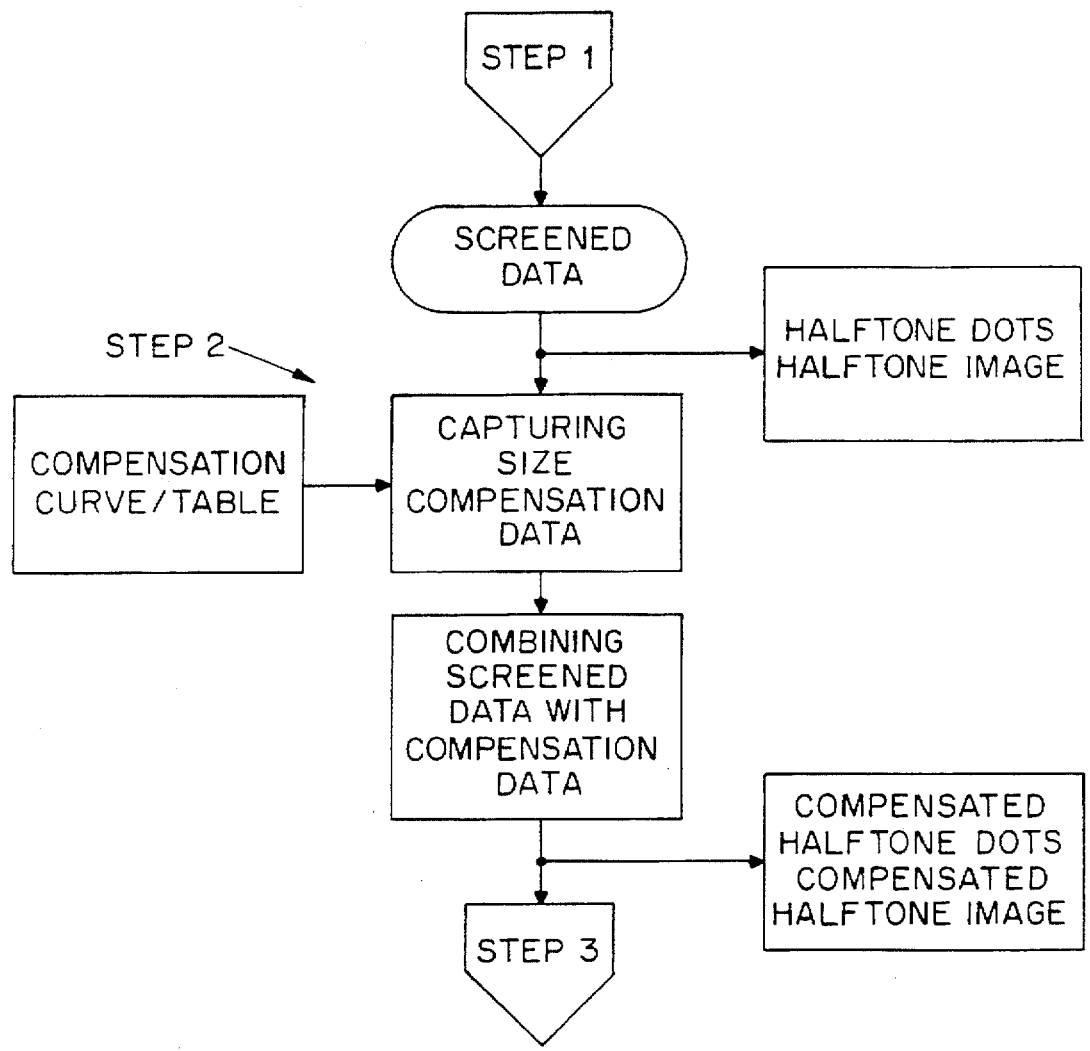
FIG. 9 is a flowchart illustrating basic steps of a second embodiment according to the present invention.

In a further preferred embodiment of the present invention (see FIG. 9), said modulating comprises the steps of capturing size compensation data with respect to a tone value on a tone scale; and combining said screened data with said compensation data to obtain size modulated data representative of compensated halftone dots.

It may be stated that in this embodiment, and also in the immediately following embodiment, a compensating manipulation is carried out on the screened data before using them in the exposing step.

In other embodiments to be described later on, said compensating manipulation will be carried out in real time ("on the fly").

In one embodiment of the present invention, said compensating manipulation is based on an individual scan line and on evaluating the dot pattern surrounding each dot to be imaged (socalled left and right neighbours). In a further embodiment of the present invention, said compensating manipulation is based on a larger area, including adjacent dots in previous and succeeding scan lines (socalled previous and succeeding neighbours).

Figure 10:
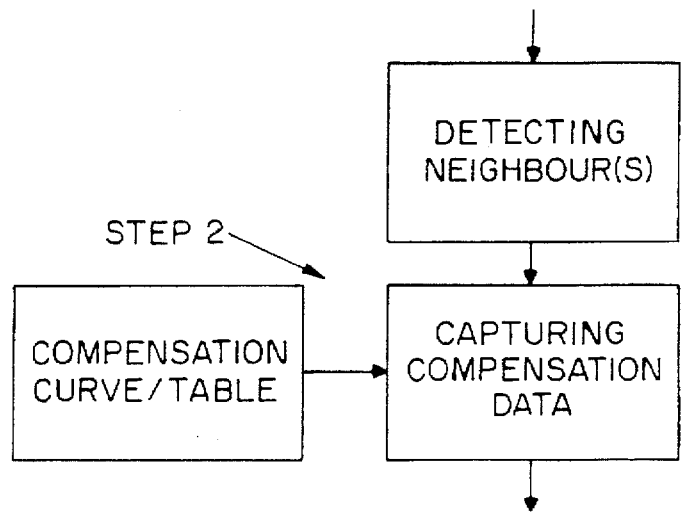
FIG. 10 is a flowchart illustrating basic steps of a third embodiment according to the present invention.
Figure 11:
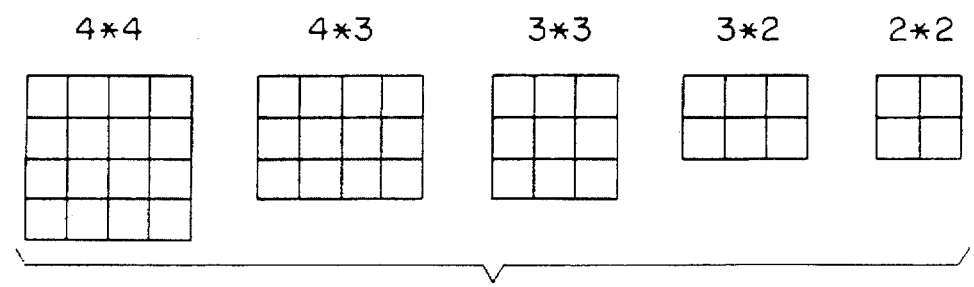
FIG. 11 illustrates an exemplary sequence of halftone dots the size or composition whereof is modulated by varying the number of microdots (or rels) composing said halftone dots.

In a still further preferred embodiment of the present invention (see FIG. 10), said modulating comprises the steps of capturing screened data representative of a first halftone dot; detecting at least one other halftone dot within a neighbourhood of said first halftone dot; forming compensation data for said first halftone dot with respect to said detecting; combining said screened data with said compensation data to obtain size modulated data representative of compensated halftone dots; and repeating all steps for each halftone dot to be printed.

In a foregoing embodiment, said compensating manipulation is carried out rather straight-on or "in feedforward" in that it relies solely on an aimed location on a tone scale; e.g. in order to make a good record of a halftone dot corresponding to 3% nominally, a size compensation is made corresponding to 3.5%.

In a following embodiment, said compensating manipulation is carried out with checking an actual presence or absence of halftone dots within a neigbourhood; e.g. if adjacent to a first halftone dot corresponding to 3% nominally no other halftone is present, a size compensation is made corresponsing to 3.5% for said first halftone dot.

Thus in a preferred embodiment of the present invention, an exposure for rendering halftone dots is varied in accordance with the number of neighbouring halftone dots.

Figure 6:
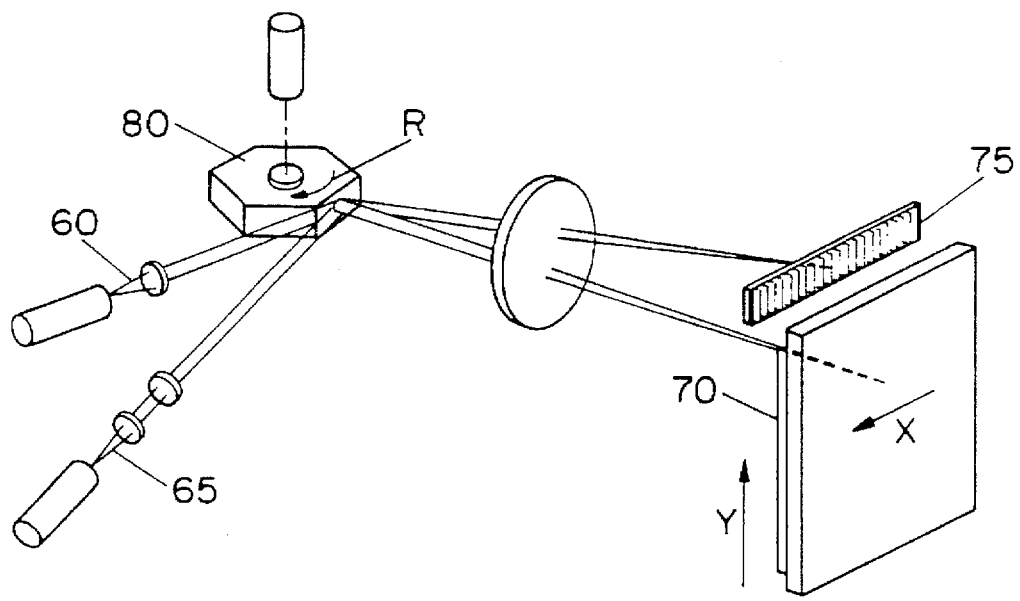
FIG. 6 schematically shows a flat bed type scanning device for use in a method according to the present invention.
Figure 7:
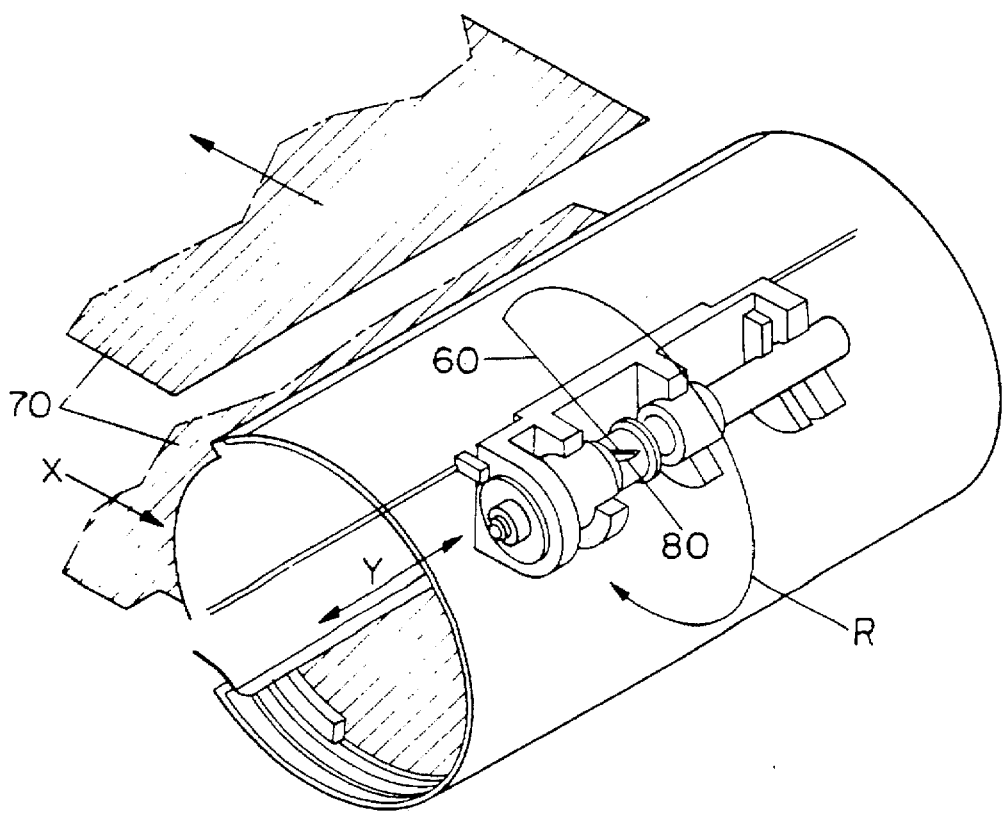
FIG. 7 schematically shows in internal drum type scanning device for use in a method according to the present invention.

In order to explain more deeply the size modulation of the scanwise exposure of an imaging element according to the present invention, attention is given now to the exposure system itself. As an example, but non-limitative as to the scope of protection, a method for preparing a printing plate is known in which the method comprises the steps of informationwise exposing an imaging element and thereafter processing the exposed imaging element. Such a method is known as a computer to plate method, and can be carried out with the aid of different types of scanning devices. FIG. 6 schematically shows a flat bed type scanning device for use in a method according to the present invention; wheras FIG. 7 schematically shows an internal drum type scanning device for use in a method according to the present invention.

For a deeper description of these scanning devices, reference is made to an application entitled "Time modulated stochastic screening" and filed on the even day (and incorporated herein). Concerning FIG. 6, an even more thorough description may be found in EP-A-94.203.326.7 (in the name of Agfa-Gavaert).

Imagewise exposure in accordance with the present invention may proceed by a scanwise exposure by means of e.g. Cathode Ray Tubes (CRT's), Light Emitting Diodes (LED—'s) or lasers directly on the printing plate precursor, or it may be performed by first exposing according to said screened data an intermediate photographic film of high contrast, generally a high contrast silver halide film, and then using the imaged photographic film as a mask for exposing a lithographic printing plate precursor to a conventional light source in a camera exposure or contact exposure.

Examples of lasers that can be used in connection with the present invention are e.g. HeNe lasers, Argon ion lasers, semiconductor laser, YAG lasers e.g. Nd-YAG lasers etc.

According to a further preferred embodiment of the present invention, a method for generating a screened reproduction of a contone image comprises the steps of frequency modulation screening said contone image to obtain a halftone image comprising halftone dots; compensating a size or a shape of said halftone dots; and scanwise exposing an imaging element by at least one light source according to said compensated halftone dots, wherein said compensating is carried out is accordance to an estimation of a local density in a neigbourhood of said halftone dots.

In a still further preferred embodiment of the present invention, said estimation is based on a contone value of a pixel corresponding to said halftone dot or to a number of halftone dots within a halftone neigh-bourhood.

Preferred embodiments for making a lithographic printing plate

According to a further preferred embodiment of the present invention, a method for making a lithographic printing plate from a contone original comprises the steps of frequency modulation screening said original to obtain screened data, modulating said screened data to obtain "size modulated data"; scanwise exposing a printing plate precursor by a light source according to said size modulated data; and developing a thus obtained scanwise exposed lithographic printing plate precursor.

Imagewise exposure in accordance with the present invention may proceed by a scanwise exposure by means of e.g. a laser directly according to said screened data on the printing plate precursor (socalled computer to plate) or it may be performed by first exposing according to said screened data an intermediate photographic film of high contrast, generally a high contrast silver halide film, and then using the imaged photographic film as a mask for exposing a lithographic printing plate precursor to a conventional light source in a camera exposure or contact exposure. An example of such an intermediate photographic film (as imaging element) is marketed by Agfa-Gevaert NV under the name AGFASTAR.

Examples of photosensitive lithographic imaging elements are, for example, the silver salt diffusion transfer (generally referred to as DTR) materials disclosed in EP-A-410500, EP-A-483415, EP-A-423399, imaging elements having a photosensitive layer containing diazonium salts or a diazo resin as described for example in EP-A-450199, and imaging elements having a photosensitive layer containing a photopolymerizable composition as described for example in EP-A-502562, EP-A-491457, EP-A-503602, EP-A-471483 and DE-A-4102173.

A preferred method for making a lithographic printing plate from a contone original according to the present invention comprises an additional step of developing a thus obtained imagewise exposed imaging element.

One process for obtaining a lithographic printing plate by means of a DTR process uses an imaging element comprising, in the order given, a support with a hydrophilic surface such as a grained and anodized aluminium foil, a layer of physical development nuclei and a silver halide emulsion layer. An example of such an imaging element is marketed by Agfa-Gevaert NV under the name LITHOSTAR. The imaging element of the present embodiment is imaged using a scanning exposure followed by a development step in the presence of development agent(s) and silver halide solvent(s) so that a silver image is formed in the physical development nuclei layer. Subsequently the silver halide emulsion layer and any other optional hydrophilic layers are removed by rinsing the imaged element with water so that the silver image is exposed. Finally the hydrophobic character of the silver image is preferably improved using a finishing liquid comprising hydrophobizing agents. More technical details about said development may be found in e.g. EP-A-93.201.3.5.5 and U.S. Ser. No. 08/303,670 (both in the name of Agfa-Gevaert).

A second type of mono-sheet DTR material comprises on a support in the order given a silver halide emulsion layer and an image receiving layer containing physical development nuclei e.g. a heavy metal sulphide such as PdS. The image receiving layer is preferably free of binder or contains a hydrophilic binder in an amount of not more than 30% by weight. Subsequent to imagewise exposure, the mono-sheet DTR material is developed using an alkaline processing liquid in the presence of developing agents e.g. of the hydroquinone type and/or pyrazolidone type and a silver halide solvent such as e.g. a thiocyanate. Subsequently, the plate surface is neutralised with a neutralising liquid. Details about the constitution of this type of mono-sheet DTR material and suitable processing liquids can be found in e.g. EP-A-423399, U.S. Pat. No. 4,501,811, and U.S. Pat. No. 4,784,933. Lithographic printing plate precursors of this type are marketed by Agfa-Gevaert NV under the names SETPRINT and SUPERMASTER.

It may also be clear that said scanwise exposing can be carried out by a light source with a visible spectrum or with an infrared spectrum or with an ultraviolet spectrum, depending on the actual imaging elements. Imaging elements suitable for DTR processing typically have a maximum sensitivity within the range of 400 to 800 nm, depending upon the nature of the imaging element. Thus, LITHOSTAR LAP-B has a maximum sensitivity at about 490 nm, LITHOSTAR LAP-O has a maximum sensitivity at about 550 nm, and SUPERMASTER imaging elements also have a maximum sensitivity at about 550 nm. Thus, the writing light beam 60 preferably has a wavelength within the range of 400 to 800 nm, such as from 450 to 600 nm.

Sensitivity spectra for imaging elements which can be used in the method according to the present invention may be found in the already mentioned EP-A-94.203.3326.7.

Alternatively, a lithographic printing plate may be prepared from a "heat mode" recording material as a lithographic imaging element. Upon application of a heat pattern in accordance with image data and optional development the surface of such heat mode recording material may be differentiated in ink accepting and ink repellent areas. The heat pattern may be caused by a light source such as a laser. The heat mode recording material includes a substance capable of converting the light into heat. Heat mode recording materials that can be used for making a lithographic imaging elements are described for example in EP-A-92201633, DE-A-2512038, FR-A-1473751, Research Disclosure 19201 of April 1980 and Research Disclosure 33303 of January 1992.

In order to clearly demonstrate some remarkable advantages of the present invention, now the results of some experiments will be discussed.

Figure 4:
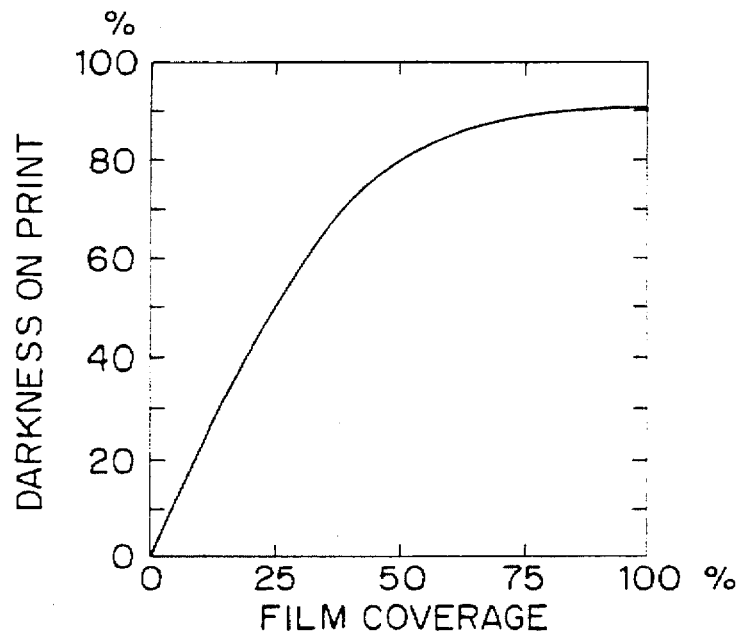
FIG. 4 is a socalled plate-press curve.

For an easy understanding, first FIG. 4 is referenced again. As mentioned earlier (in the background of the invention). FIG. 4 is a socalled plate-press curve according to the prior art and illustrates the effects of recorder gain and dot again.

Using an apparatus as shown in the FIGS. 6 or 7, a commercially available silver salt diffusion transfer lithographic printing plate LITHOSTAR LAP-B was informationwise exposed with screened cyan, magenta, yellow and black separations of a color image. The image was screened by frequency modulation using the method of the present invention and the imaging element was subsequently developed using the processing liquid G5000B and the finishing liquid G5300B, each available from Agfa-Gevaert NV.

The soformed printing plates were used on a conventional printing machine Heidelberg GTO52 using Hartmann Irocart inks to print 50 copies on paper sheet. The dampening liquid used was an aqueous solution containing 100% Rotamatic (commercially available from Rotaprint). The printing paper used was Zanders Ikonorex. The printed copies were examined and assessed for quality, specifically for contrast, tone range and finest rendered microdot size.

Figure 13:
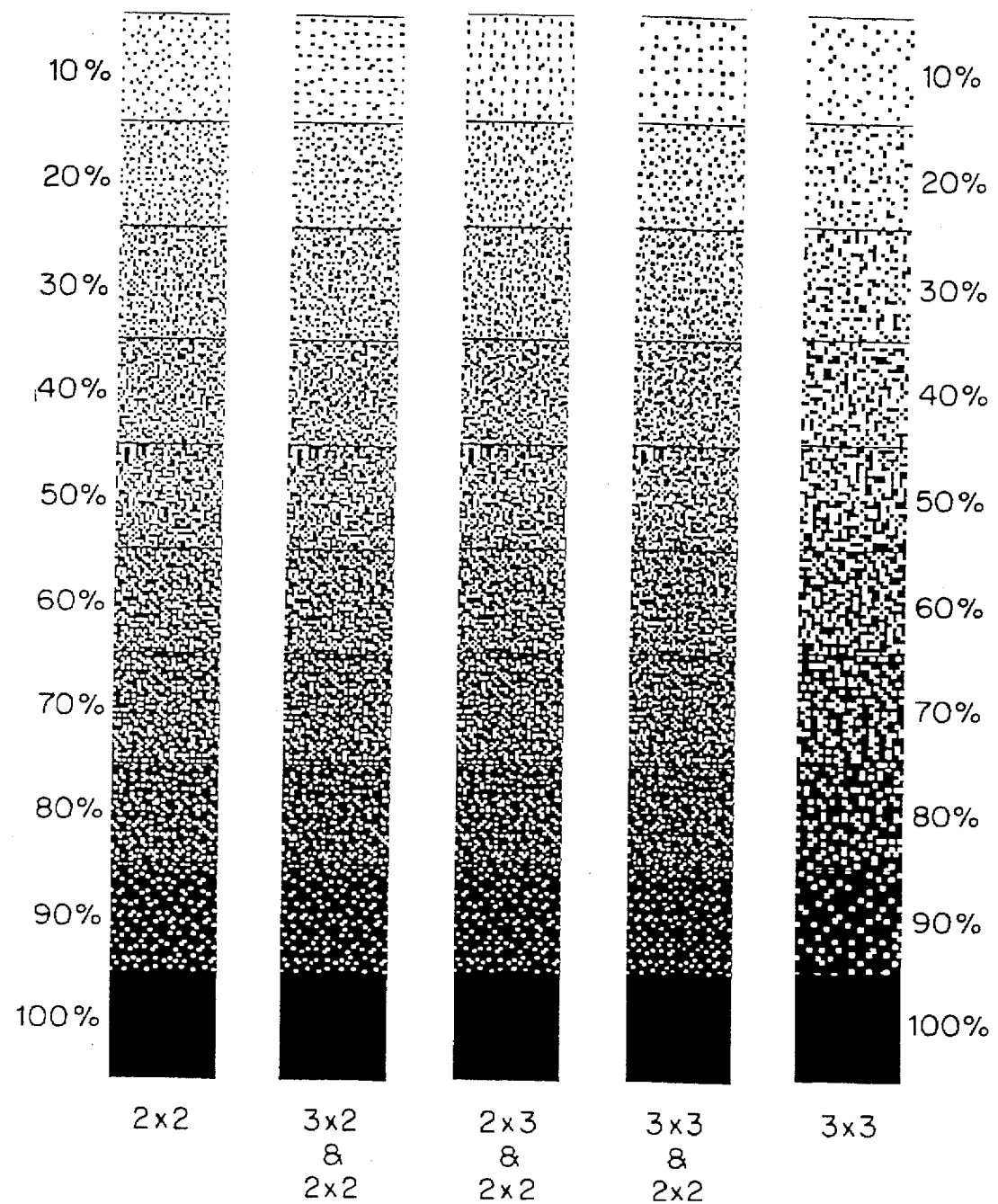
FIG. 13 compares the results of experiments attained by either constant halftone dots sizes or by size modulated halftone dots.

FIG. 13 illustrates the results of comparative experiments on vareous coverages (up to 100%) attained by using constant halftone dot sizes (comprising 2×2 rels as indicated by the most left figure or comprising 3×3 rels as indicated by the most right figure) or by using size modulated halftone dots (comprising first 3×2 and then 2×2 rels as indicated by the second left figure; comprising first 2×3 and then 2×2 rels as indicated by the third figure; comprising first 3×3 and then 2×2 rels as indicated by the fourth figure).

Figure 15A:
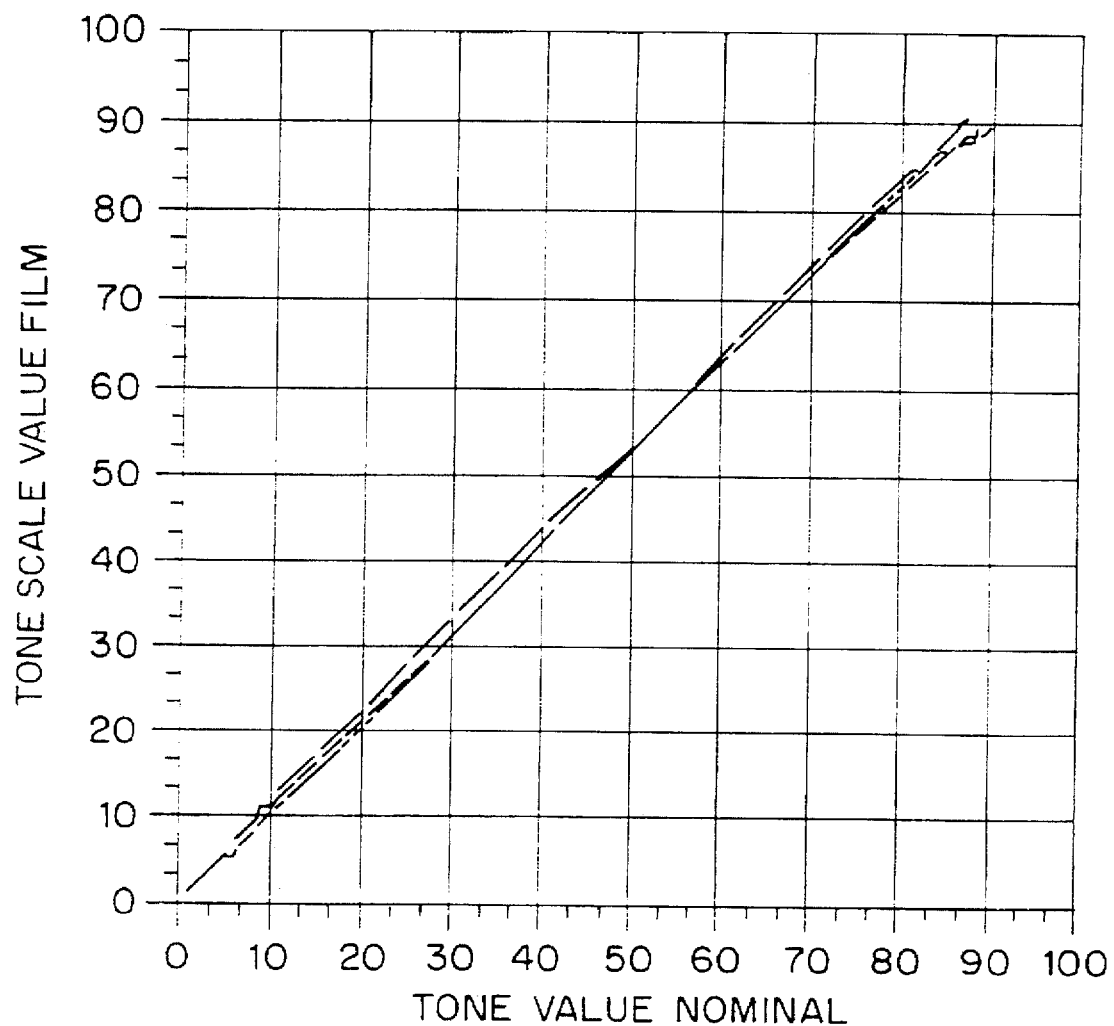
FIG. 15 illustrates results of comparative experiments according to the present invention and indicating the relation between nominal tone values and tone values measured on an intermediate film.
Figure 15B:
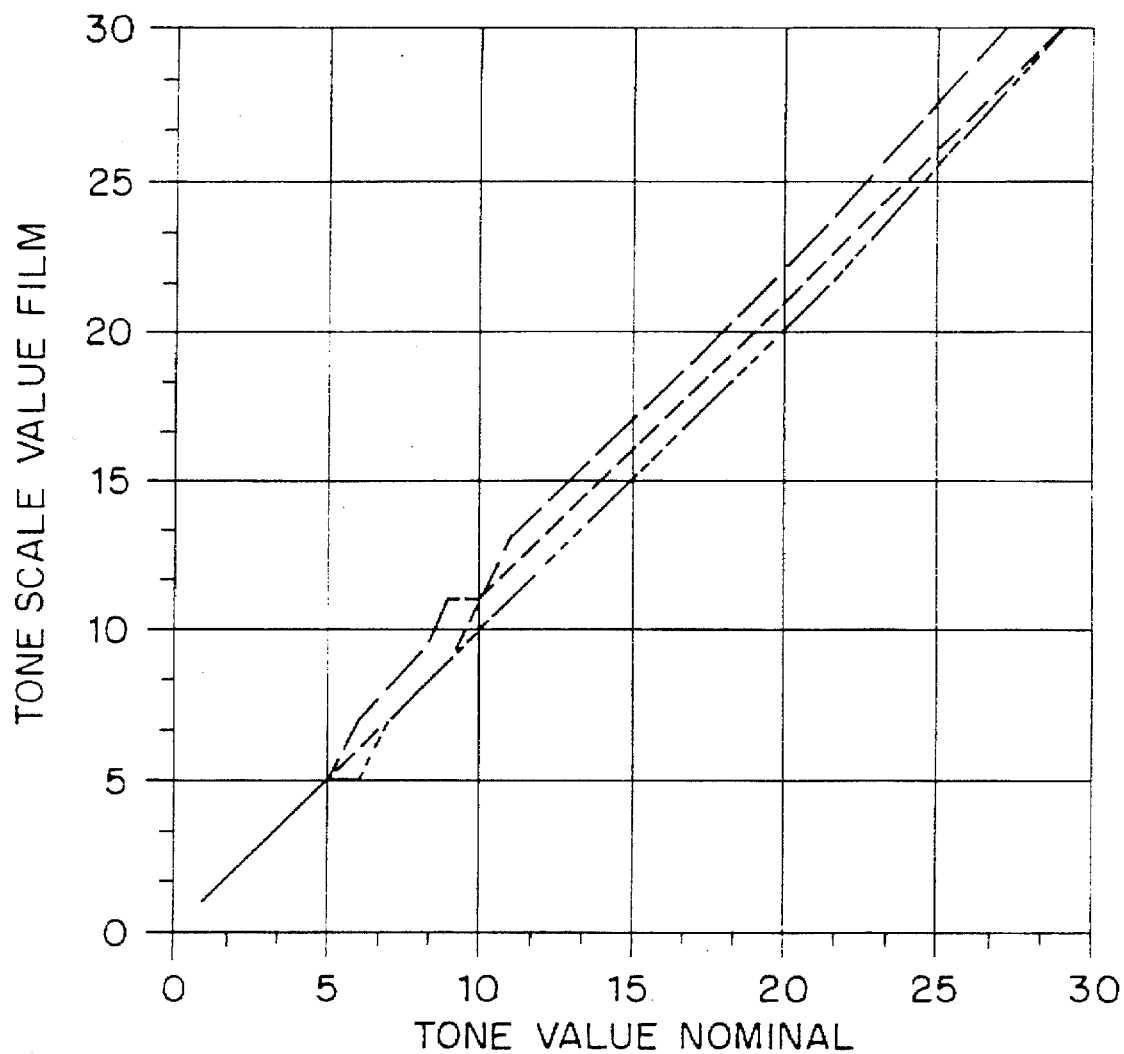

FIG. 15 illustrates results of comparative experiments according to the present invention and indicates the relation between nominal tone values and tone values measured on an intermediate film.

Figure 16A:
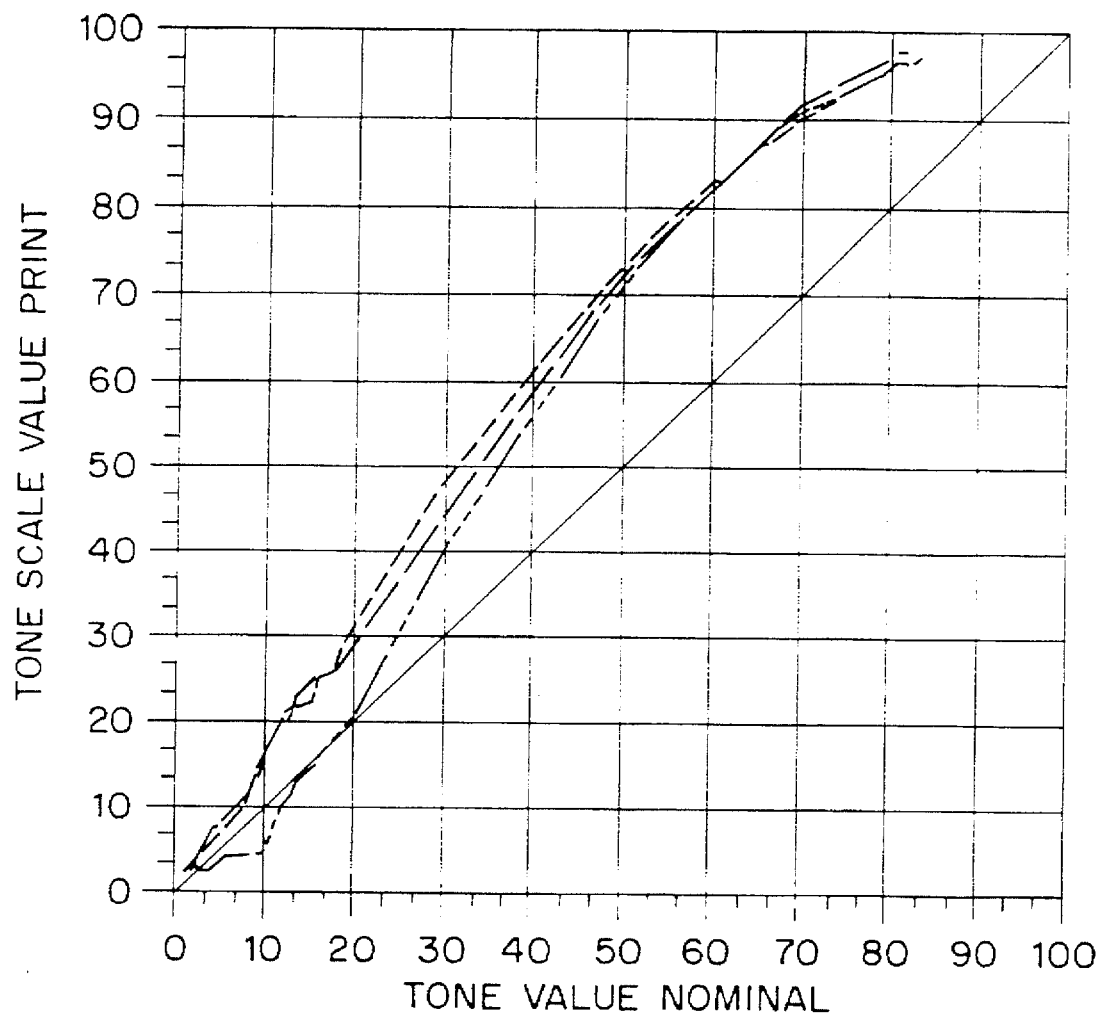
FIG. 16 illustrates results of comparative experiments according to the present invention and indicating the relation between nominal tone values and tone values measured on a final print.
Figure 16B:
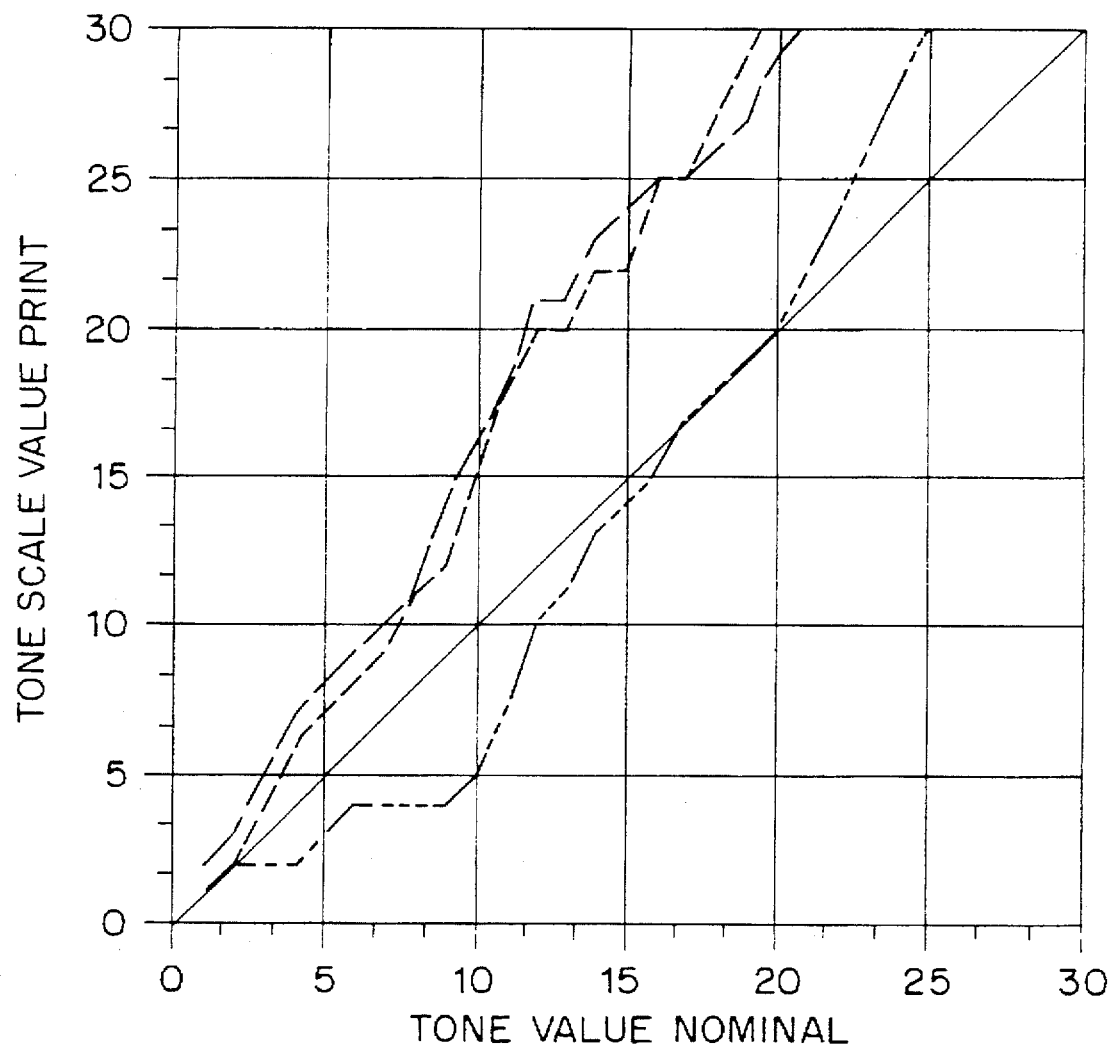

FIG. 16 illustrates results of comparative experiments according to the present invention and indicates the relation between nominal tone values and tone values measured on a final print.

From these experiments, it may be clearly seen that the present invention provides a screened reproduction of a contone image with improved reproduction characteristics, especially in the highlight and shadow tones of an image and without graininess in the midtones.

Further applicability of the present invention

As may be clear from the description given before, a selective distortion correction, which adjusts only the small dots and has no effect on the large dots, allows to improve the halftone rendition so that an optimum number of halftone levels can be obtained on film or plates. The present invention provides a method for generating a screened reproduction of a contone image with a minimized loss of tonal range in the light tints due to dot loss and in the dark tints due to dot gain. It also provides an improved halftone rendition so that an optimum number of halftone levels can be obtained on film or plates.

The method described in this invention improves the faithful rendition of small dots by selective correction of small overexposure areas, thus eliminating the need for tightly controlled spot sizes or materials with high gradients. This implies that the correction method described in this invention can be applied to improve the output quality of less expensive flat field laser recorders and direct to plate exposure systems, exposing plates which do not have the steep gradient and short toe characteristics of graphic arts films. It may be noticed that the problem of insufficient quality, particulary of tone range in the final print, arises especially with imaging elements which are sensitive to edge-sharpness defects.

In case of a color image, the above described screening process is performed on each of the color separations of the image. Preferably the color image is separated in its Yellow, Magenta, Cyan and Black components. Each of these components may then be screened and used to imagewise expose four lithographic printing plate precursors according to the present invention. Four lithographic printing plates, one for each color separation, will thus be obtained. The color separations can then be printed over each other in register in a lithographic printing machine using the four plates.

Figure 12:
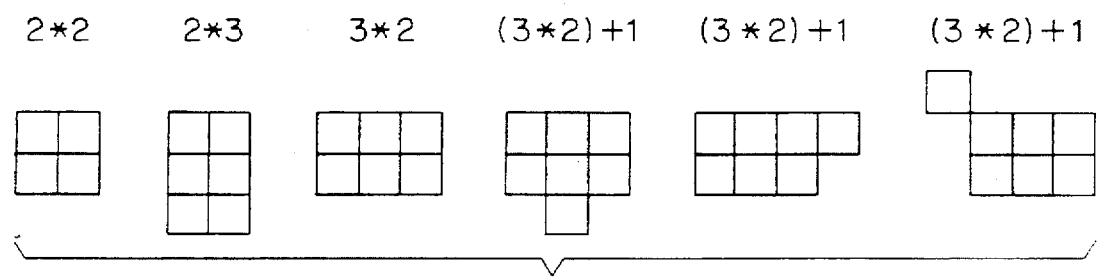
FIG. 12 illustrates exemplary halftone dots comprising different numbers of microdots (or rels) in non-regular forms.

Herabove, a halftone dot has mainly been presented as having a square or a rectangular shape. However, it also may be stated that optionally "a non-regular halftone dot" represented by a "non-regular matrix" of [m*n+p] is also included within the scope of the present invention (wherein p is an integer). E.g. a halftone dot of 2*3+1 rels is schematically shown in FIG. 12.

We claim:

1. A method for generating a screened reproduction of a multiple tone image comprising the steps of:

frequency modulation or stochastic screening said multiple tone image to obtain screened data representing tones of said multiple tone image in terms of halftones dots;

reproducing said halftone dots on an imaging element by means of a scanwise exposure, wherein the size or composition of said halftone dot is modulated by varying the number of microdots (or rels) composing a halftone dot in accordance with the number of neighboring halftone dots.

2. A method according to claim 1 wherein said imaging element is a lithographic printing plate precursor having a surface capable of being differentiated in ink accepting and ink repellant areas upon scanwise exposure and an optional development step.

3. A method according to claim 2 wherein said lithographic printing plate precursor contains a silver halide emulsion layer and an image receiving layer containing physical development nuclei and wherein subsequent to said scanwise exposure said lithographic printing plate is developed using an alkaline processing liquid in the presence of developing agent(s) and silver halide solvent(s).

* * * * *

UNITED STATES PATENT AND TRADEMARK OFFICE
CERTIFICATE OF CORRECTION

PATENT NO.  : 5,677,093

DATED       : October 14, 1997

INVENTOR(S) : Delabastita et al.

It is certified that error appears in the above-identified patent and that said Letters Patent is hereby corrected as shown below:

Column 4, line 19, "dispersed" should read --dispersed highlights and shadows). It is a big advantage of the present--;

Column 6, line 26, "is a circle;" should read --is a rectangle; the diameter when said halftone neighborhood is a circle;--;

Column 7, line 27, "127" should read --128--.

Signed and Sealed this

Nineteenth Day of May, 1998

*Attest:*

BRUCE LEHMAN

*Attesting Officer*     *Commissioner of Patents and Trademarks*